United States Patent
Kobayashi

(10) Patent No.: US 6,348,662 B1
(45) Date of Patent: Feb. 19, 2002

(54) CIRCUIT BOARD ASSEMBLY

(75) Inventor: Makoto Kobayashi, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/511,347

(22) Filed: Feb. 23, 2000

(30) Foreign Application Priority Data

Feb. 24, 1999 (JP) .......................................... 11-046194

(51) Int. Cl.⁷ ........................... H01R 12/04; H05K 1/11
(52) U.S. Cl. ............................................................. 174/261
(58) Field of Search ................................. 174/261–267

(56) References Cited

U.S. PATENT DOCUMENTS

| | | | |
|---|---|---|---|
| 4,065,850 A | * | 1/1978 | Burr et al. .................... 29/625 |
| 5,281,770 A | * | 1/1994 | Kamei et al. ............... 174/261 |
| 5,801,335 A | | 9/1998 | Brussalis |

FOREIGN PATENT DOCUMENTS

| | | |
|---|---|---|
| EP | 727841 | 8/1996 |
| EP | 887884 | 12/1998 |
| FR | 2531597 | 10/1984 |

OTHER PUBLICATIONS

European Search Report EP 00 10 3890.

* cited by examiner

*Primary Examiner*—Albert W. Paladini
*Assistant Examiner*—Jeremy Norris
(74) *Attorney, Agent, or Firm*—Bierman, Muserlian and Lucas

(57) ABSTRACT

A circuit board assembly including an insulative substrate and a busbar located on the upper surface thereof. There is at least one cavity in the substrate with a boss projecting therefrom. An expanded section of the boss is provided adjacent the bottom of the cavity and the busbar has an insertion opening, corresponding to the shape of the boss, through which the boss projects. The boss is adapted to be pressed toward the expanded portion so as to overlie a part of the substrate, thereby fixing the busbar thereto. This configuration permits the assembly to be made smaller, with attendant savings in production costs and improvements in ease of production.

9 Claims, 4 Drawing Sheets

CIRCUIT BOARD ASSEMBLY

This Application claims the benefit of the priority of Japanese Application 11-046194, filed Feb. 24, 1999.

The present Invention is directed to a circuit board assembly, particularly designed for use in an electrical connection box located in the engine compartment of an automotive vehicle. More specifically, the Invention is intended to reliably secure the busbar to the insulative substrate upon which it is located.

BACKGROUND OF THE INVENTION

A typical prior art assembly of the general type to which the present Invention is directed is shown in FIGS. 5(*a*) and 5(*b*). Circuit board assembly 50 includes insulative substrate 51 with busbar 53 mounted thereon. Upstanding ribs 52 are located at the edges of the substrate and surround at least a portion of the busbar.

At predetermined locations between upstanding ribs 52, bosses 56 project from insulative substrate 51. The bosses are substantially in the form of circular columns with heights which are greater than those of the upstanding ribs. At the base of boss 56 is taper 57, having a taper diameter L2, which reinforces the boss.

Busbar 53, which is stamped from a single sheet of metal, is disposed between upstanding ribs 52. Insertion opening 55 is provided in the busbar to permit the insertion of boss 56 therethrough. Once busbar 53 is in position, boss 56 is pressed downward, as shown in FIG. 5(*b*), to fix the busbar on the substrate, thereby completing circuit board assembly 50.

However, the foregoing assembly has certain defects. Since taper 57 extends upwardly from the upper surface of insulative substrate 51, insertion opening diameter L3 has to be greater than taper diameter L2 in order to permit this section to pass therethrough. In addition, busbar 53 must provide a predetermined width W on either side of insertion opening 55 in the radial direction thereof. Thus, the outer dimension of busbar 53 is equal to L3+2 W. The distance between busbar 53 and boss diameter L1 is wasted space which, upon exertion of pressure on boss 56, is filled by the expansion of the boss as shown in FIG. 5(*b*). Since busbar 53 must be of a predetermined minimum size in order to carry the amount of current required, the overall dimension is increased, requiring a larger insulative substrate than would otherwise be necessary. In addition to the size, the costs of production of the assembly, as well as those of the electrical connection box in which it will be housed, are also increased.

SUMMARY OF THE INVENTION

It is an object of the present Invention to overcome the foregoing problems and, in particular, provide a circuit board wherein wasted space is minimized or eliminated. As a result, the circuit board—as well as the electrical connection box encasing it—is reduced in size, thereby cutting its cost.

The circuit board assembly according to the present Invention comprises an insulative substrate with a busbar disposed on the upper surface thereof. At least one cavity is provided in the insulative substrate and a boss projects therefrom. An expanded section of the boss is located adjacent the bottom of the cavity and the boss extends through the insertion opening in the cavity. By having the expanded section of the boss within the cavity, it is then possible to have the insertion opening in the busbar of smaller diameter than in the corresponding prior art opening. Thereafter, the boss is pressed toward the substrate to cause it to flatten out and overlie the busbar. At the same time, a slight expansion of the diameter of the boss takes place so that any gap between the periphery of the insertion hole and the boss is filled and the busbar is securely affixed to the insulative substrate.

The upper end of the expanded section may extend so that it is coplanar with the upper surface of the insulative substrate;

however, it is preferable that the expanded section be entirely within the substrate so that the upper end of the expanded section is below the plane of the upper surface of the insulative substrate. It is also preferable that the expanded section constitute a taper in the direction away from the bottom of the cavity. However, the Invention is not limited to a particular shape of the expanded section, it can be a shelf or in some other form, so long as it fits within the cavity and does not extend beyond it.

It has been found desirable to taper the distal end of the boss in the direction away from the substrate. This assists in inserting the boss into the insertion opening (or in placing the insertion opening over the boss).

Between the tapered portion of the boss and the expanded section, the central section, having a central diameter, is located. As a result, the insertion opening in the busbar can be made substantially the same diameter as—or only very slightly greater than—the central diameter. This minimizes or eliminates any wasted space. If a small gap is present, it is readily filled when the boss is deformed under pressure, with or without the application of heat.

It has been found useful to provide a plurality of upstanding ribs on the upper surface of the insulative substrate. These add strength to the assembly and also serve to contain the busbar. It has also been found desirable to allow a slight gap between the perimeter of the busbar and the upstanding ribs adjacent thereto. This gap should preferably be equal to the gap (if any) between the busbar and the central section of the boss. It is also preferable that the boss be of sufficient height so that it extends above the ribs. This facilitates the application of pressure to the boss and its resultant flattening out to affix the busbar to the insulative substrate.

In production, the busbar is placed between the ribs on the upper surface of the insulated substrate with the boss extending through the insertion opening. Thereafter, pressure (and optionally heat) is exerted on the boss in the direction of the expanded section. This flattens the boss so that it overlies a portion of the substrate and also causes the central portion of the boss to expand and fill the central gap between the circumference of the insertion opening and the boss, thereby reliably securing the busbar to the substrate and completing the assembly.

BRIEF DESCRIPTION OF THE DRAWINGS

In the accompanying drawings, constituting a part hereof, and in which like reference characters indicate like parts.

DETAILED DESCRIPTION OF THE INVENTION

Figure 1:
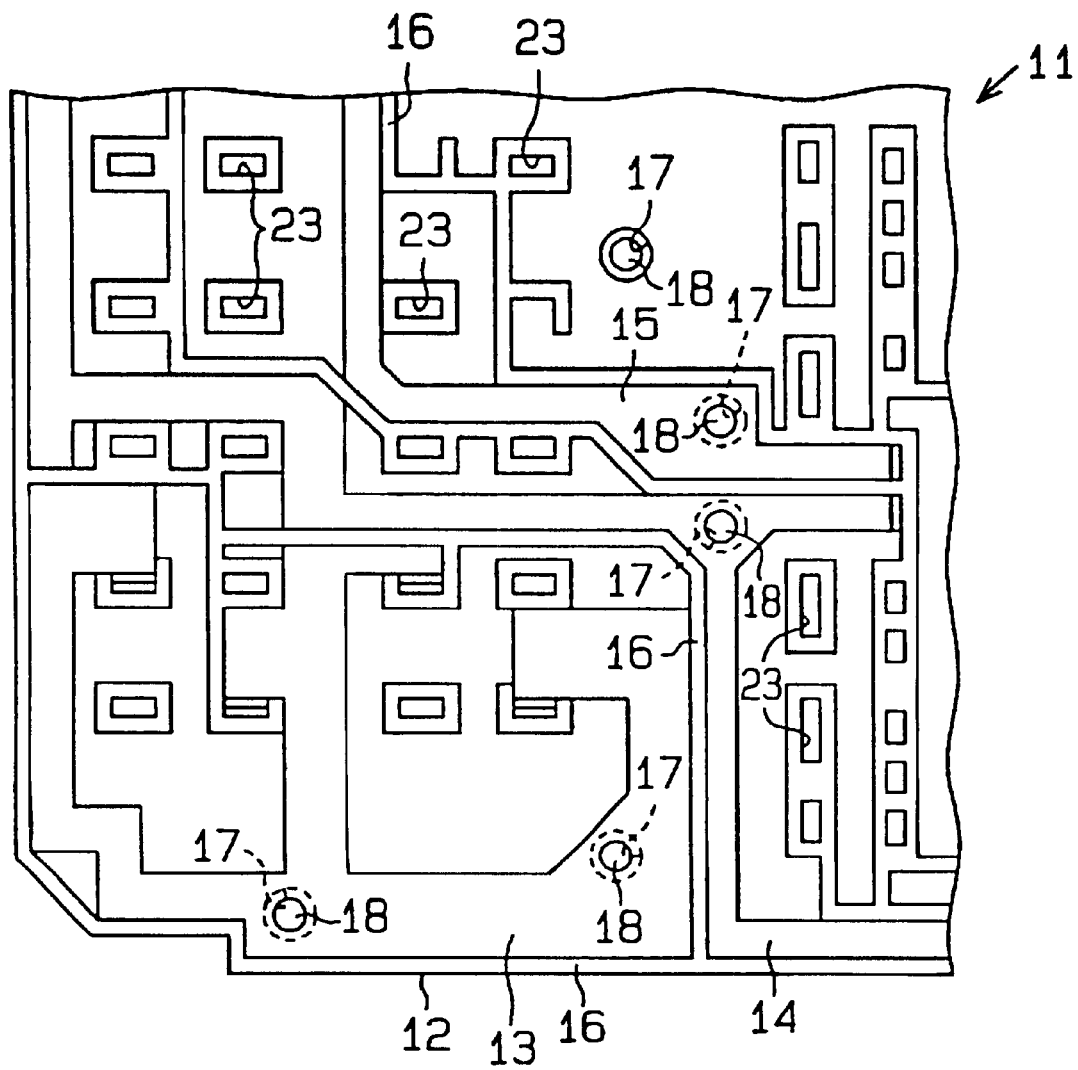
FIG. 1 is a plan view of the circuit board assembly of the present Invention.
Figure 2:
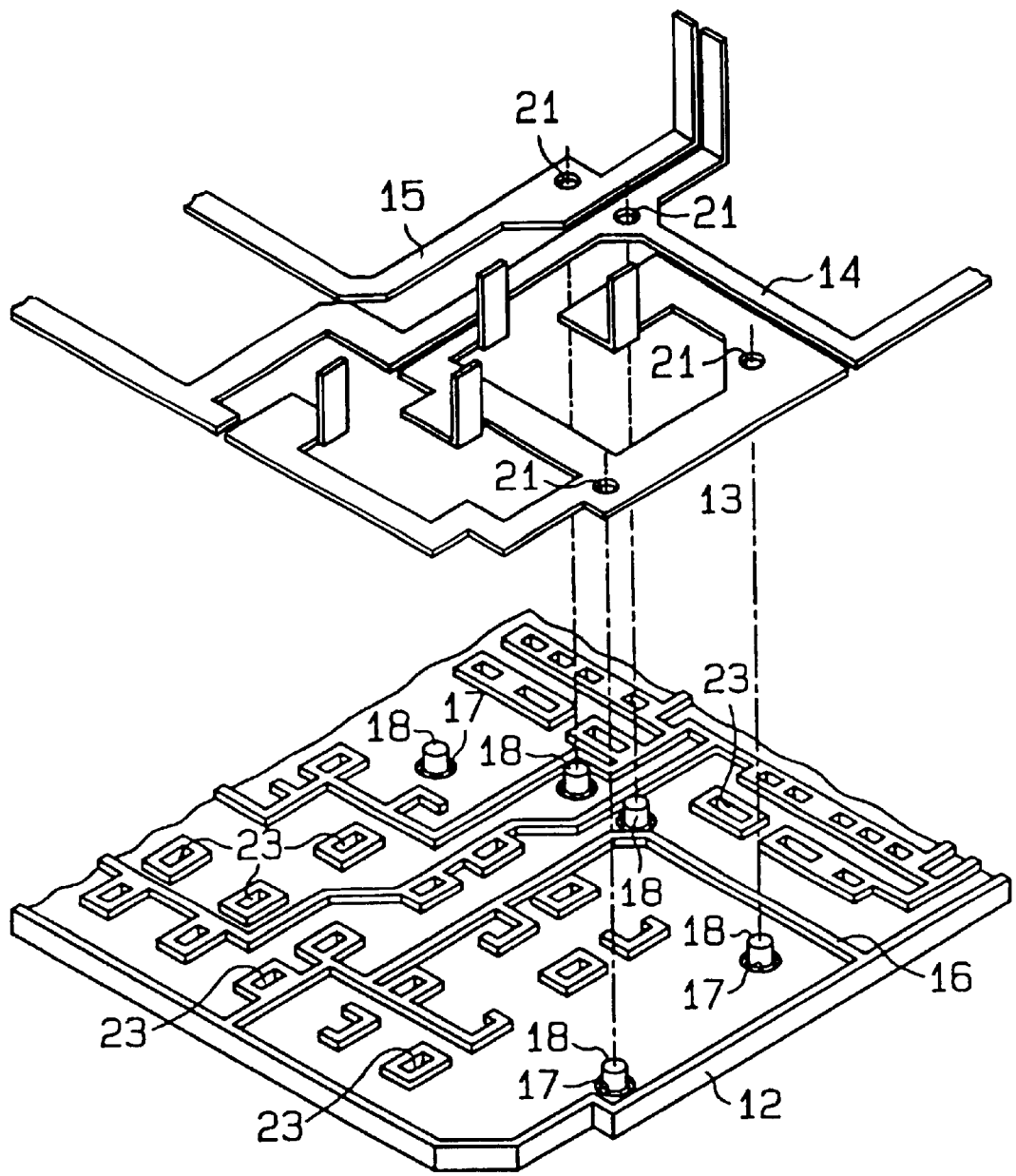
FIG. 2 is an exploded perspective view of the circuit board assembly of FIG. 1.
Figure 3:
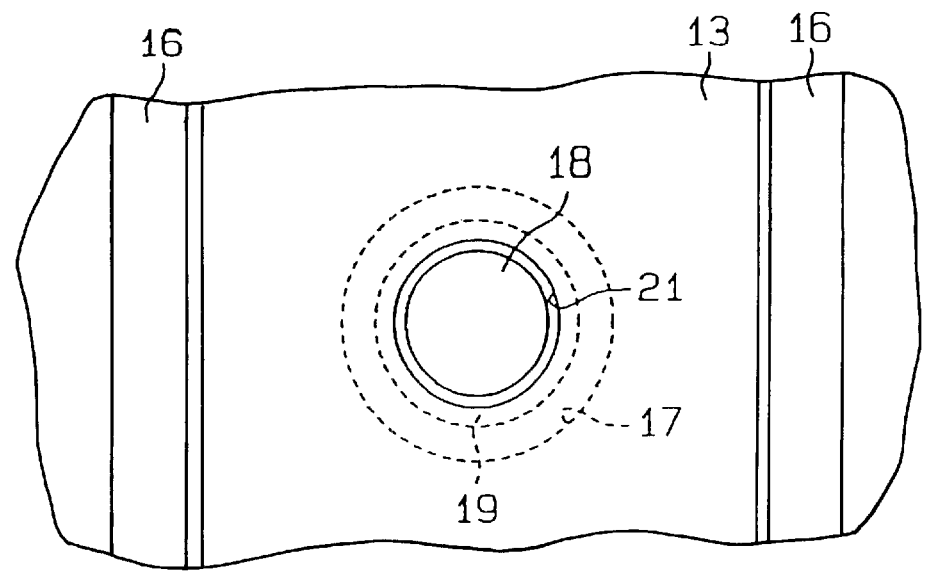
FIG. 3 is a fragmentary expanded plan view of the region surrounding one of the bosses of the circuit board assembly.

Circuit board assembly 11 comprises insulative substrate 12 and busbars 13, 14, and 15. Bosses 18 project upwardly from insulative substrate 12 and the lower portions thereof are located in cavities 17. Insulative ribs 16 also project upwardly from insulative substrate 12 and surround busbars 13, 14, and 15. Certain of the ribs are also provided with rib openings 23 as shown in FIGS. 1 and 2.

Figure 4A:
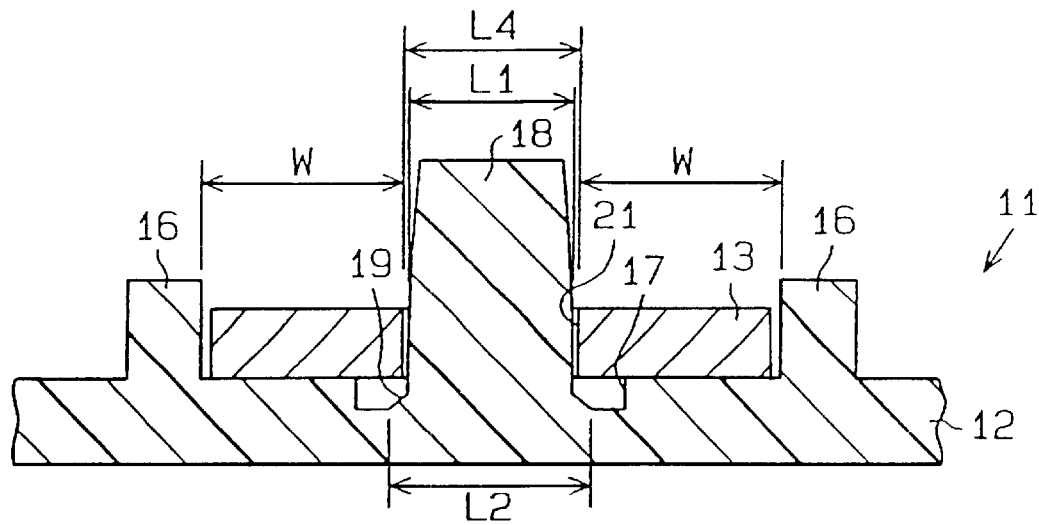
FIG. 4(*a*) is a cross section of the circuit board assembly of FIG. 4 after the busbar has been placed on the insulative substrate but before the boss has been flattened.
FIG. 4(b) is a view, similar to that of FIG. 4(a), after the boss has been flattened.
Figure 4B:
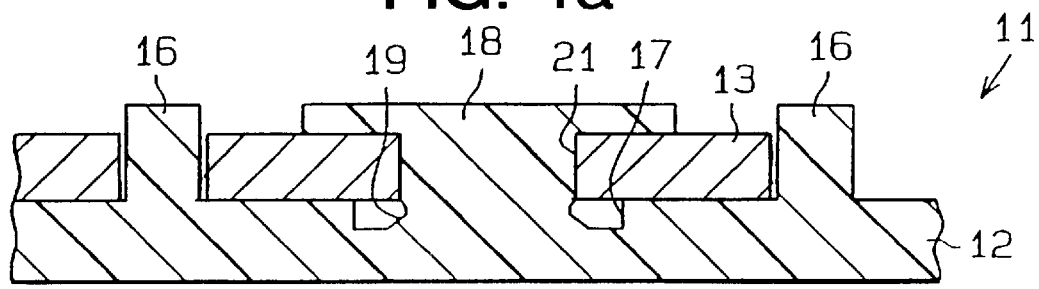

As best shown in FIGS. 4(a) and 4(b), boss 18 has taper 19 at its base. This taper is located entirely within cavity 17 and insertion opening 21 has insertion opening diameter L4 which is only slightly larger than central diameter L1.

Once boss 18 of insulative substrate 12 projects through insertion opening 21, the assembly is in the first stage as shown in FIG. 4(a). Thereafter, pressure (and optionally heat) is applied to the distal end of boss 18 whereby it is flattened as shown in FIG. 4(b). The flattened portions of boss 18 overlie portions of busbar 13 and insertion opening 21 is fully filled by the central portion of the flattened boss.

Since taper 19 is fully within cavity 17, diameter L4 of insertion opening 21 on busbars 13, 14, and 15, can be kept at a minimal value so that diameter L4 is virtually the same as diameter L1 of boss 18. Since the minimum width of the busbar is W, the total diameter of the busbar and boss combination is L4+2 W which, in the case of the present Invention, is almost the same as L1+2 W. In other words, the width of the busbars where the insertion opening is formed can be kept to a minimal value. This permits good wiring efficiency for the assembly, keeps the size down, and limits the cost of the insulative substrate. Therefore, the electrical connection box, into which the assembly is to be placed, can also be reduced in size and cost.

Figure 5A:
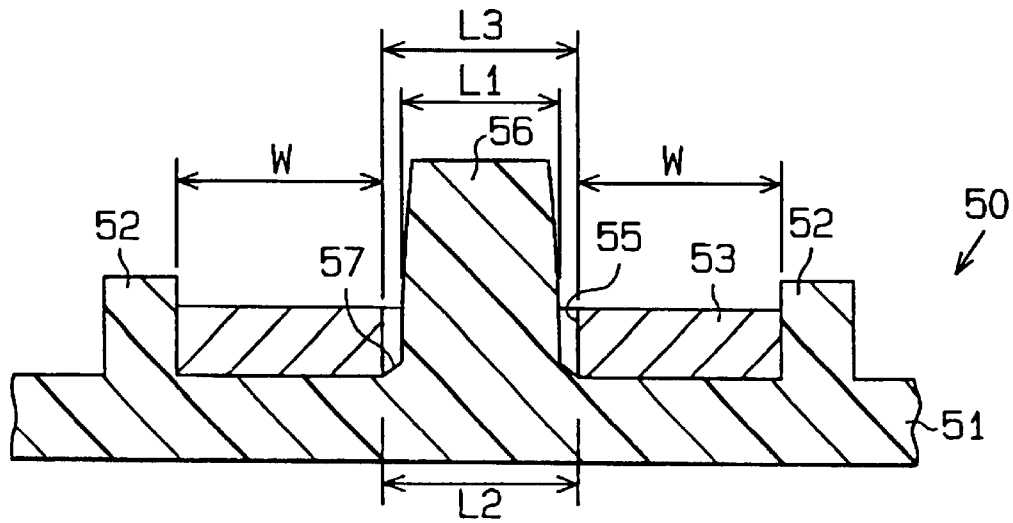
FIG. 5(a) are views, corresponding to FIGS. 4(a) and and 5(b) 4(b), respectively, of a prior art device.
Figure 5B:
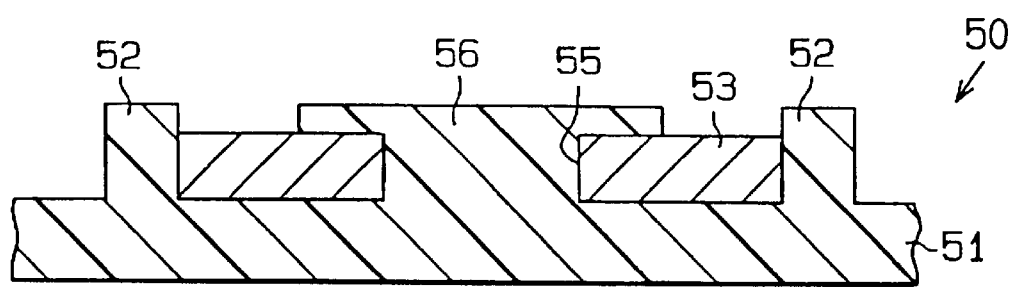

Moreover, since all of the components (except the busbars) are preferably integral with each other, a single die for making the insulative substrate can be formed by only minor modifications of the die used for the prior art insulative substrate as shown in FIG. 5 hereof. This further limits production cost increases.

Although only a limited number of specific embodiments of the present Invention has been expressly described, such changes and modifications as would be apparent to the person of ordinary skill may be made without departing from the scope or spirit thereof. For example, boss 18 need not be circular in cross section, other shapes such as rectangular, triangular, oval, etc. can be used with substantially equal effect. In these cases, the insertion opening in the busbar must, of course, be of approximately the same shape as the boss.

Although taper 19 has been described as terminating no higher than the plane of the upper surface of the insulative substrate, it can project slightly above. However, the more it projects, the less advantage the present Invention provides. As a further modification, a plurality of insulative substrates may be stacked on one another with busbars disposed on each one.

As can be seen from the foregoing, the present Invention is to be broadly construed and not to be limited except by the character of the claims appended hereto.

What is claimed is:

1. A circuit board assembly comprising an insulative substrate and a busbar disposed on an upper surface thereof, at least one cavity in said insulative substrate below the upper surface of said substrate, a boss projecting from said cavity, an expanded section of said boss located in said cavity, at least one insertion opening in said busbar, said boss extending through said insertion opening, said boss adapted to be pressed toward said expanded portion so as to overlie part of said substrate, thereby fixing said busbar to said insulative substrate.

2. The circuit board assembly of claim 1 wherein an upper end of said expanded section is coplanar with said upper surface of said insulative substrate.

3. The circuit board assembly of claim 1 wherein said expanded section is entirely within said cavity.

4. The circuit board assembly of claim 1 wherein said expanded section tapers in a direction away from a bottom of said cavity.

5. The circuit board assembly of claim 4 wherein there is a tapered section of said boss adjacent a distal end of said boss remote from said expanded section, said tapered section tapering toward said distal end.

6. The circuit board assembly of claim 5 wherein said boss has a central section between said tapered section and said expanded section, said central section having a central diameter, said insertion opening having an insertion diameter which is slightly larger than said central diameter.

7. The circuit board assembly of claim 6 wherein there is a central gap between said central diameter and said insertion diameter, said central gap being filled when said boss is pressed toward said expanded section.

8. The circuit board assembly of claim 7 comprising a plurality of upstanding ribs on said upper surface of said insulative substrate adjacent a portion of a perimeter of said insulative substrate, a perimeter gap between said perimeter of said busbar and said ribs substantially equal to said central gap.

9. The circuit board assembly of claim 8 wherein said ribs extend beyond said busbar and said tapered section extends beyond said ribs.

* * * * *